(12) United States Patent
Delos et al.

(10) Patent No.: US 11,057,125 B1
(45) Date of Patent: Jul. 6, 2021

(54) PROGRAMMABLE DIGITAL LOOPBACK FOR RF APPLICATIONS

(71) Applicant: Analog Devices, Inc., Norwood, MA (US)

(72) Inventors: Peter Delos, Greensboro, NC (US); Carroll C. Speir, Pleasant Garden, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/912,524

(22) Filed: Jun. 25, 2020

(51) Int. Cl.
| H04K 1/02 | (2006.01) |
| H04L 25/03 | (2006.01) |
| H04L 25/49 | (2006.01) |
| H04B 17/14 | (2015.01) |
| H04B 1/40 | (2015.01) |

(52) U.S. Cl.
CPC .............. H04B 17/14 (2015.01); H04B 1/40 (2013.01)

(58) Field of Classification Search
CPC ........... H04B 17/14; H04B 1/40; H04B 17/21
USPC ....... 375/221, 219, 220, 222, 235, 231, 296, 375/297
See application file for complete search history.

(56) References Cited

U.S. PATENT DOCUMENTS

| 8,290,450 B2 * | 10/2012 | Hammerschmidt ... H04B 17/21 455/114.1 |
| 9,880,261 B2 | 1/2018 | Subbaraj et al. |
| 10,530,611 B1 | 1/2020 | Manglani et al. |
| 10,564,274 B2 | 2/2020 | Delos et al. |
| 2010/0002620 A1 | 1/2010 | Proctor, Jr. et al. |
| 2011/0134970 A1 | 6/2011 | Yi et al. |
| 2019/0303348 A1 | 10/2019 | Manglani et al. |
| 2019/0341922 A1 | 11/2019 | Behel et al. |

OTHER PUBLICATIONS

*MxFE® Quad, 16-Bit, 12 GSPS RF DAC and Dual, 12-Bit 6 GSPS RF DAC*, AD9082, Analog Devices, Preliminary Technical Data, © 2019, 3 pages.
*Monolithic/Hybrid Analog to Digital (A/D) Converter*, Circuits Today, Apr. 23, 2020, www.circuitstoday.com/monolithichybrid-analog-to-digital-ad-converter, 11 pages.
(Continued)

*Primary Examiner* — Phuong Phu
(74) *Attorney, Agent, or Firm* — Patent Capital Group

(57) ABSTRACT

Various approaches to implementing digital loopback in a radio frequency (RF) system are disclosed. An example RF system includes a receiver that includes an ADC and a transmitter that includes a DAC. The apparatus includes multiple digital loopback circuits provided at different points between the digital domain processing of the receiver and the transmitter. Each digital loopback circuit may include a combiner and one or more weighing circuits, which make the circuit programmable. The combiner of a given digital loopback circuit is configured to combine a RX signal and a TX signal at a particular point of the digital domain processing of the receiver and the transmitter where said digital loopback circuit is implemented. The one or more weighting circuits are configured to define the how much of the TX signal and/or RX signal is used for said combination.

28 Claims, 6 Drawing Sheets

(56) References Cited

OTHER PUBLICATIONS

*MxFE® Quad, 16-Bit, 12 GSPS RF DAC and Quad, 12-Bit, 4 GSPS RF ADC*, AD9081, Analog Devices, Preliminary Technical Data, © 2019, 3 pages.
Huang et al., *ADC/DAC Loopback Linearity Testing by DAC Output Offsetting and Scaling*, IEEE Transactions on Very Large Scale Integration (VLSI) Systems, vol. 19, No. 10, Oct. 2011, 11 pages.
*AXIOM_LLSDADC1024fs*, High Accuracy Low Latency ΣΔ ADC, Teledyne DALSA Everywhereyoulook™ © 2104, 14 pages.
Agoro, *AFE76xx as a Single-Chip Wideband Repeater Using Loopback Mode*, Application Report, SLAA863, Nov. 2018, Texas Instruments, 12 pages.
Agoro, *AFE74xx as a single-chip wideband repeater using loopback mode*, Application Report, SLAA871, Jan. 2019, Texas Instruments, 19 pages.
Andrews, *Digital Radio Frequency Memory Technology & Techniques for EW*, KRATOS, Electronics Production Division, Feb. 14, 2020, 49 pages.

\* cited by examiner

PROGRAMMABLE DIGITAL LOOPBACK FOR RF APPLICATIONS

TECHNICAL FIELD OF THE DISCLOSURE

The present disclosure generally relates to electronic devices, and, more specifically, to digital loopback circuits for radio frequency (RF) applications.

BACKGROUND

Digital loopback testing is a powerful technique for testing various components of an electronic device/system, as well as for adjusting the signals to be transmitted, and may be particularly advantageous for use in RF systems.

A variety of factors can affect the cost, quality and robustness of digital loopback circuits included in an RF system. Physical limitations such as space/surface area, as well as limitations that may be imposed by regulations, can pose further constraints to the requirements or specifications of digital loopback circuits. Thus, trade-off and ingenuity have to be exercised in designing digital loopback for RF applications.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
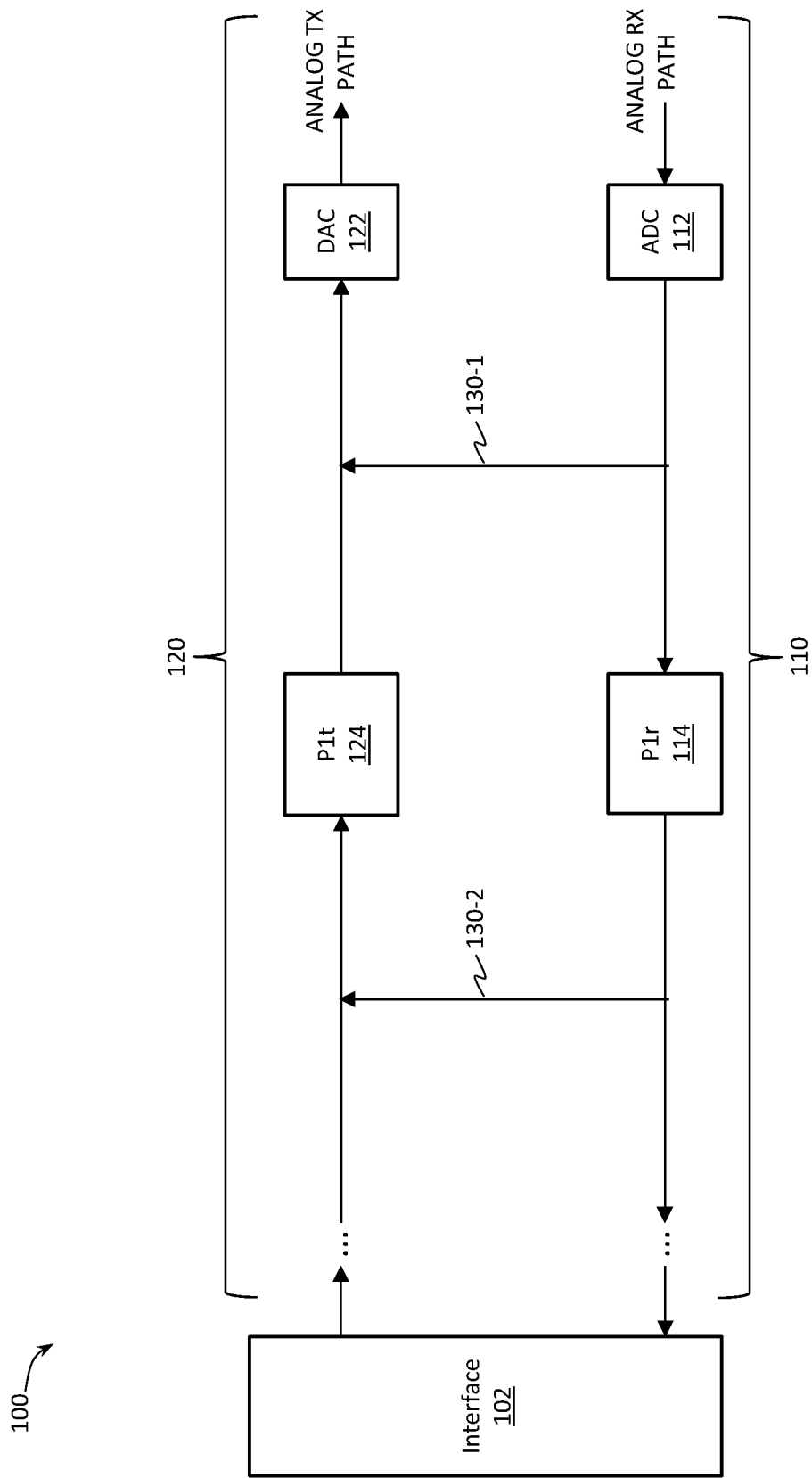
FIG. 1 provides a schematic block diagram of a receiver and a transmitter of an example RF system according to prior art.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating programmable digital loopback for RF applications, proposed herein, it might be useful to first understand phenomena that may come into play in RF systems. The following foundational information may be viewed as a basis from which the present disclosure may be properly explained. Such information is offered for purposes of explanation only and, accordingly, should not be construed in any way to limit the broad scope of the present disclosure and its potential applications.

RF systems are systems that transmit and receive signals in the form of electromagnetic waves in the RF range of approximately 3 kilohertz (kHz) to 300 gigahertz (GHz). At a high level, an RF system may include a transmitter and a receiver (i.e., the RF system may be an RF transceiver). The transmitter is configured to process and transmit RF signals, signals to be transmitted referred to herein as transmit (TX) signals. The receiver is configured to receive and process RF signals, signals received by the receiver referred to herein as receive (RX) signals. The transmitter includes at least one digital-to-analog converter (DAC), where signals processed before the DAC are in the digital domain, and signals processed after the DAC are in the analog domain, eventually leading to an antenna wirelessly transmitting RF signals based on the signal processing in the transmitter. The receiver includes at least one analog-to-digital converter (ADC), where signals processed before the ADC are in the analog domain, which signals are based on the antenna receiving wireless RF signals, and signals processed after the ADC are in the digital domain. In this context, "digital loopback" refers to providing digital signals from the digital domain processing portion of the receiver to the digital domain processing portion of the transmitter. Digital loopback may be used for purposes of testing, setting optimal operating parameters, or generating/adjusting signals to be transmitted by an RF system. RF systems where digital loopback may be used are ubiquitous and include examples such as cellular wireless communications, phased array systems, automotive and industrial radar, RF repeaters, digital RF memory, electronic warfare, and many more. For example, in the next generation of high-speed converters where both ADCs and DACs are implemented on a single die, including one or more digital loopback paths between an output of an ADC and an input of a DAC provides a unique competitive advantage.

Inventors of the present disclosure realized that existing implementations of digital loopback may suffer from not being sufficiently flexible and versatile so that a given RF device with one or more digital loopback circuits may be used for different purposes.

Embodiments of the present disclosure provide various approaches to implementing digital loopback in RF systems. In one aspect of the present disclosure, an example RF system includes a receiver that includes an ADC and a transmitter that includes a DAC. The apparatus includes multiple digital loopback circuits provided at different points between the digital domain processing of the receiver (i.e., after the ADC) and the transmitter (i.e., before the DAC). Each digital loopback circuit may include a combiner and one or more weighting circuits, which make the circuit programmable. The combiner of a given digital loopback circuit is configured to combine a RX signal and a TX signal at a particular point of the digital domain processing of the receiver and the transmitter where said digital loopback circuit is implemented. The one or more weighting circuits are configured to define the how much of the TX signal and/or RX signal is used for said combination. Including multiple digital loopback circuits, each of which includes a combiner and one or more weighting circuits advantageously allows programming how and when digital loopback is implemented, providing the much-needed flexibility and versatility to RF devices implementing such loopback circuits. For example, it enables blending of loopback data from various points in the digital signal processing (DSP) chain and may enable additional modes of operating RF systems. RF systems with programmable digital loopback circuits as described herein may be used in a variety of applications, such as digital RF memory (DRFM), electronic warfare, RF repeaters, as well as testing of various components of the RF system.

As will be appreciated by one skilled in the art, aspects of the present disclosure, in particular aspects of programmable digital loopback circuits as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing RF transceivers, RF converters, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., a programmable digital loopback circuit may be referred to simply as a "digital loopback," etc.). If used, the terms "substantially," "approximately," "about," etc., may be used to generally refer to being within +/−20% of a target value, e.g., within +/−10% of a target value, based on the context of a particular value as described herein or as known in the art.

Conventional RF System

FIG. 1 provides a schematic block diagram of a receiver 110 and a transmitter 120 of an example RF system 100 according to prior art. As shown in FIG. 1, the receiver 110 may include an ADC 112 and a processing unit P1r 114, while the transmitter 120 may include a DAC 122 and a processing unit P1t 124. The dots shown within the receiver 110 are intended to illustrate that multiple processing units similar to the processing unit P1r may be implemented within the receiver 110, while the dots shown within the transmitter 120 are intended to illustrate that multiple processing units similar to the processing unit P1t may be implemented within the transmitter 120. As also shown in FIG. 1, the RF system 100 may further include an interface 102, coupled to each of the receiver 110 and the transmitter 120. The interface 102 may be configured to couple the receiver 110 and the transmitter 120 to a digital block that may include further signal processing components (not shown in FIG. 1), where the digital block is configured to perform various functions related to digital processing of the TX signals so that information can be encoded in the TX signals and function related to digital processing of the RX signals so that information encoded in the RX signals can be extracted. In some embodiments, such a digital block may be what is known in the art as "PHY," which commonly refers to circuitry used to perform physical layer functions.

In the RX path of the RF system 100, an RF signal may be received by one or more antennas (not specifically shown in FIG. 1), and an electrical signal representative of the received RF signal (RX signal) may be provided, in analog domain form, to the ADC 112. The ADC 112 is configured to covert the RX signal from the analog to the digital domain for further processing in the digital form. The processing unit P1r 114 may perform such processing, e.g., may perform digital downconversion of the RX signal from the RF frequency to a lower frequency, e.g., to a baseband frequency, and may then send the processed RX signal off the chip via the interface 102. In the TX path of the RF system 100, a signal to be transmitted (TX signal) may be provided, via the interface 102, to the transmitter 120, where it may be processed in the digital domain by one or more processing units, e.g., be upconverted from a lower to a higher frequency by the processing unit P1t 124. The processed TX signal may then be converted to the analog domain by the DAC 122, to eventually be transmitted in a wireless form by one or more antennas.

FIG. 1 illustrates that the RF system 100 may include a first digital loopback path 130-1 and a second digital loopback path 130-2. For the first digital loopback path 130-1, at least a portion of the signal generated by the ADC 112 may be provided back to the transmitter 120, to be further provided to the DAC 122. For the second digital loopback path 130-2, at least a portion of the signal generated by the processing unit P1$r$ 114 may be provided back to the transmitter 120, to be further provided to the processing unit P1$t$ 124. The digital loopback paths 130 are not programmable, meaning that how the loopback signals are provided from the receiver 110 to the transmitter 120 and how these signals are processed in the transmitter 120 is fixed at the design time.

Example RF Systems with Programmable Digital Loopback Circuits

Figure 2:
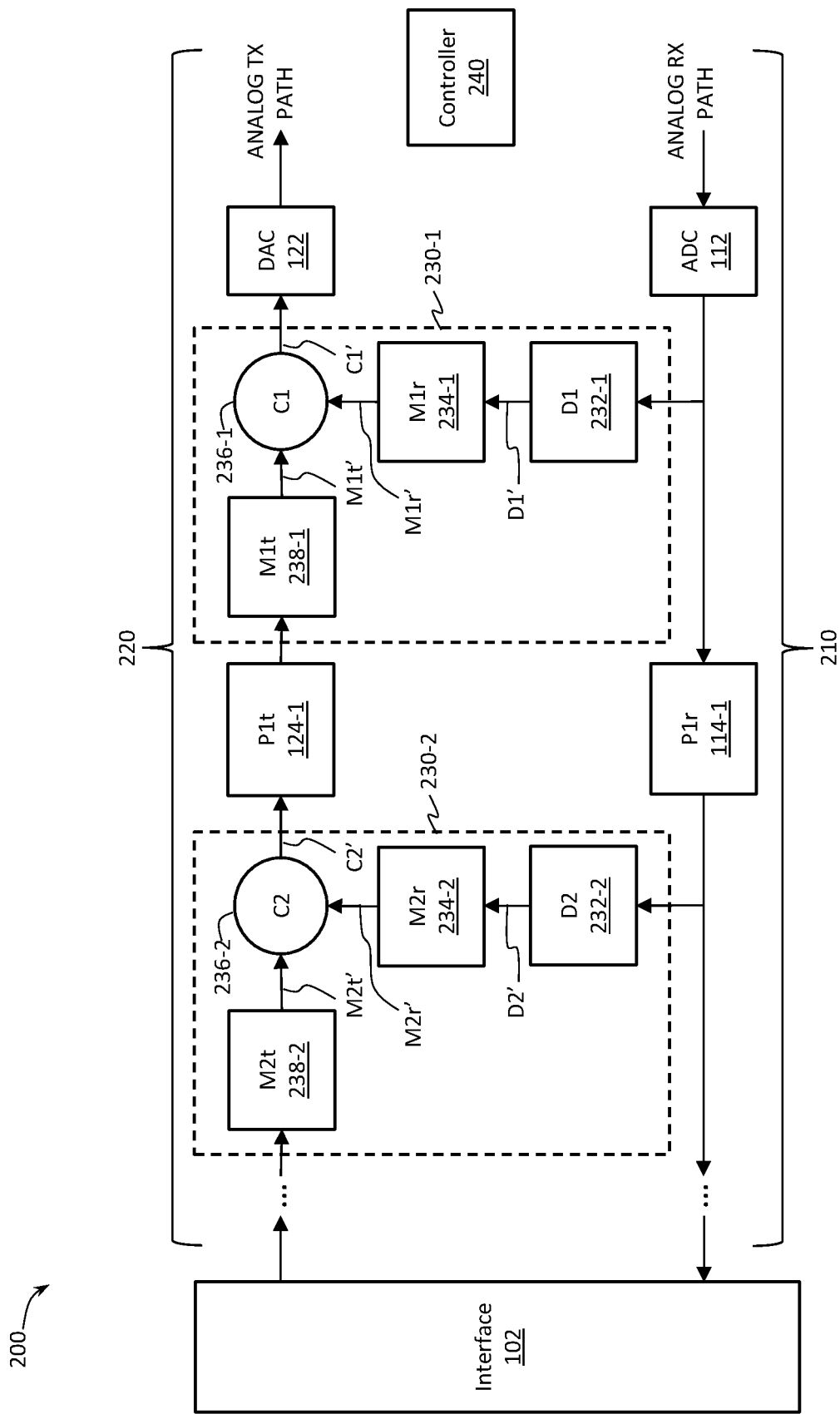
FIG. 2 provides a schematic block diagram of an example RF system with a plurality of programmable digital loopback circuits, according to some embodiments of the present disclosure.

Inventors of the present disclosure realized that further improvements can be made to implementing digital loopback paths 130 by making them programmable instead of fixed. FIG. 2 provides a schematic block diagram of an example RF system 200 with a plurality of programmable digital loopback circuits, according to some embodiments of the present disclosure. As shown in FIG. 2, the RF system 200 may include the interface 102, the ADC 112, the processing unit P1$r$ 114, the DAC 122, and the processing unit P1$t$ 124 as described above with reference to FIG. 1. Similar to the RF system 100, the RF system 200 may include a receiver 210 and a transmitter 220. Instead of the fixed digital loopback paths 130, the RF system 200 may include a first digital loopback circuit 230-1 and a second digital loopback circuit 230-1, each of which may provide a programmable digital loopback. In addition, the RF system 200 may further include a controller 240.

In various embodiments, the controller 240 may either be included within the RF system 200, or be external, but communicatively coupled, to the RF system 200. The controller 240 may include any suitable device, configured to control operation of various parts of the RF system 200. For example, in various embodiments, the controller 240 may control operation of, e.g., program any of the digital loopback circuits 230 implemented in the RF system 200. In some embodiments, the controller 240 may further control other aspects, components, and features of the RF system 200 or/and the programmable digital loopback circuits 230, described herein. In some embodiments, the controller 240 may be implemented as, or include portions of, a data processing system shown in FIG. 5.

In some embodiments, at least some of the components of the receiver 210, the transmitter 220, and the digital loopback circuits 230 may be implemented monolithically, i.e., on a single substrate, die, or a chip. For example, in some embodiments, the ADC 112, the processing unit P1$r$ 114, the DAC 122, the processing unit P1$t$ 124, and the first and second digital loopback circuits 230$s$ may be implemented monolithically. Such an implementation may be particularly advantageous in terms of the speed at which the RX signals may be processed for purposes of digital loopback adjustments or testing.

The RF system 200 may be an RF transceiver, for example. In such a system, one or multiple stages of frequency conversion may be used to convert the digital TX signals from being baseband signals to being RF signals to be transmitted, and vice versa for the RX signals. When one frequency conversion stage is used, then baseband signals are converted directly to the RF signals in the TX path, and vice versa in the RX path. When multiple frequency conversion stages are used, then one or more intermediate frequency (IF) signals may be used instead. For example, with reference to the RX path, an IF may be used in superheterodyne radio receivers, in which a received RF signal is shifted/converted to an IF in a first frequency conversion stage, where the IF is a frequency lower than the RF frequency of the RX signal but higher than the baseband frequency. The signal at the IF may then be converted to baseband in a second frequency conversion stage, before the final detection of the information in the received signal is done. Conversion to an IF may be useful for several reasons. For example, when several stages of filters are used, they can all be set to a fixed frequency, which makes them easier to build and to tune. In some embodiments, the processing unit P1$t$ 124 may be a digital upconverter (DUC), configured to upconvert the TX signal that may be in baseband, provided to the processing unit P1$t$ 124 from the interface 102, to an IF TX signal, while the processing unit P1$r$ 114 may be a digital downconverter (DDC), configured to downconvert the RX signal that may be an IF RX signal provided in the digital domain from the ADC 112, to a baseband RX signal, which may then be provided to the interface 102. In other embodiments, each of the receiver 210 and the transmitter 220 may include multiple stages of, respectively, downconversion or upconversion. Furthermore, the processing units P1$t$ and P1$r$ may be implemented as a quadrature upconverter and downconverter, respectively, in which case each of them would include a first mixer and a second mixer. For example, for the RX path, the first RX path mixer of the processing unit P1$r$ may be configured for performing downconversion to generate an in-phase (I) downconverted RX signal by mixing the RX signal and an in-phase component of a local oscillator (LO) signal (the LO or the LO signal not specifically shown in FIG. 2). The second RX path mixer of the processing unit P1$r$ may be configured for performing downconversion to generate a quadrature (Q) downconverted RX signal by mixing the RX signal and a quadrature component of the LO signal, where the quadrature component is a component that is offset, in phase, from the in-phase component of the LO signal by 90 degrees. The output of the first RX path mixer may be provided to an I-signal path of the receiver 210, and the output of the second RX path mixer may be provided to a Q-signal path of the receiver 210, where the Q-signal path may be substantially 90 degrees out of phase with the I-signal path.

Turning to the first digital loopback circuit 230-1, in some embodiments, the circuit 230-1 may include at least a first loopback path, a first combiner C1 236-1, and a first TX weighting circuit M1$t$ 238-1. Optionally, the first digital loopback circuit 230-1 may also include one or more of a first delay circuit D1 232-1 and a first RX weighting circuit M1$r$ 234-1. The first loopback path may be configured to provide a signal indicative of an output of the ADC 112 to the first combiner C1. In some embodiments, each of the combiner C1 and the first TX weighting circuit M1$t$ may be implemented in the transmitter 220 between the processing unit P1$t$ and the DAC 122. The TX weighting circuit M1$t$ may be configured to apply a first TX weight to an output of the processing unit P1$t$ to generate a weighted output M1$t'$. In some embodiments, the first TX weight may be a value by which the TX weighting circuit M1$t$ effectively multiplies the input provided thereto (e.g., the input based on the output of the TX processing unit P1$t$) to generate the weighted output M1$t'$. Various ways by which a multiplication operation may be carried out are known in the art, such as, but not limited to, using a multiplier (e.g., a programmable multiplier), a bit shifter, or a multiplexer to select between predetermined settings, or implementing a finite impulse response (FIR) filter to support different weightings for different frequencies, all of which being within the scope of the present disclosure in context of multiplying a signal by a certain weight. The weights can be realized with either real signal processing or with complex weights (Ci+j*Cq). In various embodiments, the first TX weight may be either a real or a complex number. When the first TX weight is a real number, applying the first TX weight to the output of the TX processing unit P1$t$ may be configured to modify an amplitude of the output of the TX processing unit P1$t$ based on this real number. When the first TX weight is a complex number, applying the first TX weight to the output of the TX processing unit P1$t$ may be configured to modify the amplitude of the output of the TX processing unit P1$t$ based on a real portion of the complex number and configured to modify a phase of the output of the TX processing unit P1$t$ based on a complex portion of the complex number.

The first combiner C1 may be configured to combine a first TX signal and a first RX signal to generate a first combined signal C1' to be provided to the DAC 122. The combiner C1 may be configured to perform any suitable combination of the first RX signal and the first TX signal to generate the signal C1'. For example, in some embodiments, the combiner C1 may be configured to add the first RX signal and the first TX signal to generate the signal C1'. In other embodiments, the combiner C1 may be configured to perform a nonlinear combination of the first RX signal and the first TX signal to generate the signal C1'.

In some embodiments, the first TX signal may be a signal indicative of the weighted output M1$t$', received from the TX weighting circuit M1$t$.

The first RX signal may be different signals, depending on whether one or both of the delay circuit D1 and the RX weighting circuit M1$r$ are implemented.

In the embodiments of the RF system 200 where the delay circuit D1 and the RX weighting circuit M1$r$ are not implemented, the first RX signal indicative of the output of the ADC 112 that is provided to the first combiner C1 via the first loopback path may be the output of the ADC 112 (i.e., in some embodiments, the first loopback path may include a communication path between the ADC 112 and the combiner C1).

In the embodiments of the RF system 200 where the delay circuit D1 is implemented but the RX weighting circuit M1$r$ is not implemented, the RX signal indicative of the output of the ADC 112 that is provided to the first combiner C1 via the first loopback path may be the output D1' of the delay circuit D1 (i.e., in such embodiments the first loopback path may include a communication path between the ADC 112 and the delay circuit D1, and then between the delay circuit D1 and the combiner C1). The delay circuit D1 may be configured to apply a first RX delay to a signal indicative of the output of the ADC 112 to generate the first RX signal that is used by the combiner C1 to combine with the first TX signal. For example, implementing the delay circuit D1 may be desirable in case where the signal looped back from the RX path is used to generate a jamming signal. In such embodiments, the power of the jamming signal could be controlled outside of the loopback path. In another example, programmable delay may be used to match the delay of the loopback path of the circuit 230-1 with that of the circuit 230-2. In some embodiments, the delay applied by the delay circuit D1 (or other delay circuits described herein) may be programmable and/or may be programmed dynamically as other loopback delays begin to combine in the combiner C1. Such embodiments may, e.g., be useful in RF repeater applications or in DRFM applications.

In the embodiments of the RF system 200 where the RX weighting circuit M1$r$ is implemented but the delay circuit D1 is not implemented, the RX signal indicative of the output of the ADC 112 that is provided to the first combiner C1 via the first loopback path may be the output M1$r$' of the RX weighting circuit M1$r$ (i.e., in such embodiments the first loopback path may include a communication path between the ADC 112 and the RX weighting circuit M1$r$, and then between the RX weighting circuit M1$r$ and the combiner C1). The RX weighting circuit M1$r$ may be configured to apply a first RX weight to a signal indicative of the output of the ADC 112 to generate the first RX signal that may be used by the combiner C1 to combine with the first TX signal. In some embodiments, the first RX weight may be a value by which the RX weighting circuit M1$r$ multiplies the input signal provided to the RX weighting circuit M1$r$ to generate the weighted output M1$r$'. In various embodiments, the first RX weight may be either a real or a complex number. When the first RX weight is a real number, applying the first RX weight to the input signal to the RX weighting circuit M1$r$, e.g., to the signal indicative of the output of the ADC 112, may be configured to modify an amplitude of the input signal to the RX weighting circuit M1$r$ based on the real number. When the first RX weight is a complex number, applying the first RX weight to the input signal to the RX weighting circuit M1$r$ may be configured to modify the amplitude of the input signal to the RX weighting circuit M1$r$ based on a real portion of the complex number and configured to modify a phase of the input signal to the RX weighting circuit M1$r$ based on a complex portion of the complex number.

In the embodiments of the RF system 200 where both the delay circuit D1 and the RX weighting circuit M1$r$ are implemented in the first digital loopback circuit 230-1, the RX signal indicative of the output of the ADC 112 that is provided to the first combiner C1 via the first loopback path may be the output M1$r$' of the RX weighting circuit M1$r$, which was generated by the RX weighting circuit M1$r$ based on the output D1' of the delay circuit D1. In such embodiments the first loopback path may include a communication path between the ADC 112 and the delay circuit D1, between the delay circuit D1 and the RX weighting circuit M1$r$, and between the RX weighting circuit M1$r$ and the combiner C1, as shown in FIG. 2. In other embodiments of the RF system 200 where both the delay circuit D1 and the RX weighting circuit M1$r$ are implemented in the first digital loopback circuit 230-1, the order of the delay circuit D1 and the RX weighting circuit M1$r$ may be interchanged compared to what is shown in FIG. 2. In such embodiments, the RX signal indicative of the output of the ADC 112 that is provided to the first combiner C1 via the first loopback path may be the output D1' of the delay circuit D1, which was generated by the delay circuit D1 based on the output M1$r$' of the RX weighting circuit M1$r$. In such embodiments the first loopback path may include a communication path between the ADC 112 and the RX weighting circuit M1$r$, between the RX weighting circuit M1$r$ and the delay circuit D1, and between the delay circuit D1 and the combiner C1.

The second digital loopback circuit 230-2 may be similar to the first digital loopback circuit 230-1. As shown in FIG. 2, in some embodiments, the circuit 230-2 may include at least a second loopback path, a second combiner C2 236-2, and a second TX weighting circuit M2$t$ 238-2. Optionally, the second digital loopback circuit 230-2 may also include one or more of a second delay circuit D2 232-2 and a second RX weighting circuit M2r 234-2. The second loopback path may be configured to provide a second RX signal indicative of an output of the RX processing unit P1r to the second combiner C2. In some embodiments, each of the combiner C2 and the second TX weighting circuit M2t may be implemented in the transmitter 220 between the interface 102 and the TX processing unit P1t. The TX weighting circuit M2t may be configured to apply a second TX weight to a signal provided from the interface 102 or from an earlier processing stage in the transmitter 220 to generate a weighted output M2t'. In some embodiments, the second TX weight may be a value by which the TX weighting circuit M2t multiplies the input provided thereto to generate the weighted output M2t'. In various embodiments, the second TX weight may be either a real or a complex number. When the second TX weight is a real number, applying the second TX weight to the input to the TX weighting circuit M2t may be configured to modify an amplitude of the input to the TX weighting circuit M2t based on this real number. When the second TX weight is a complex number, applying the second TX weight to the input to the TX weighting circuit M2t may be configured to modify the amplitude of the input to the TX weighting circuit M2t based on a real portion of the complex number and configured to modify a phase of the input to the TX weighting circuit M2t based on a complex portion of the complex number.

The second combiner C2 may be configured to combine a second TX signal and a second RX signal to generate a second combined signal C2' to be provided to the TX processing unit P1t. The combiner C2 may be configured to perform any suitable combination of the second RX signal and the second TX signal to generate the signal C2'. For example, in some embodiments, the combiner C2 may be configured to add the second RX signal and the second TX signal to generate the signal C2'. In other embodiments, the combiner C2 may be configured to perform a nonlinear combination of the second RX signal and the second TX signal to generate the signal C2'.

In some embodiments, the second TX signal may be a signal indicative of the weighted output M2t', received from the TX weighting circuit M2t.

The second RX signal may be different signals, depending on whether one or both of the delay circuit D2 and the RX weighting circuit M2r are implemented.

In the embodiments of the RF system 200 where the delay circuit D2 and the RX weighting circuit M2r are not implemented, the second RX signal that is provided to the second combiner C2 via the second loopback path may be the output of the RX processing unit P1r (i.e., in some embodiments, the second loopback path may include a communication path between the RX processing unit P1r and the combiner C2).

In the embodiments of the RF system 200 where the delay circuit D2 is implemented but the RX weighting circuit M2r is not implemented, the RX signal indicative of the output of the RX processing unit P1r that is provided to the second combiner C2 via the second loopback path may be the output D2' of the delay circuit D2 (i.e., in such embodiments the second loopback path may include a communication path between the RX processing unit P1r and the delay circuit D2, and then between the delay circuit D2 and the combiner C2). The delay circuit D2 may be configured to apply a second RX delay to a signal indicative of the output of the RX processing unit P1r to generate the second RX signal that is used by the combiner C2 to combine with the second TX signal. Implementing the delay circuit D2 may be desirable in scenarios described above with reference to the delay circuit D1. In another example, the delay circuit D2 may be particularly useful when the TX processing unit P1t possibly modified the frequency and/or phase of the TX signal, e.g., using a numerically controller oscillator (NCO), to serve as a jammer or to perform signal cancellation. In some embodiments, a gain unit (e.g., implemented as another multiplier) may be implemented something in the transmitter 220, e.g., after the combiner C2 and/or after the combiner C1, either in the digital domain (i.e., before the DAC 122) or in the analog domain (i.e., after the DAC 122).

In the embodiments of the RF system 200 where the RX weighting circuit M2r is implemented but the delay circuit D2 is not implemented, the RX signal indicative of the output of the RX processing unit P1r that is provided to the second combiner C2 via the second loopback path may be the output M2r' of the RX weighting circuit M2r (i.e., in such embodiments the second loopback path may include a communication path between the RX processing unit P1r and the RX weighting circuit M2r, and then between the RX weighting circuit M2r and the combiner C2). The RX weighting circuit M2r may be configured to apply a second RX weight to a signal indicative of the output of the RX processing unit P1r to generate the second RX signal that may be used by the combiner C2 to combine with the second TX signal. In some embodiments, the second RX weight may be a value by which the RX weighting circuit M2r multiplies the input signal provided to the RX weighting circuit M2r to generate the weighted output M2r'. In various embodiments, the second RX weight may be either a real or a complex number. When the second RX weight is a real number, applying the second RX weight to the input signal to the RX weighting circuit M2r, e.g., to the signal indicative of the output of the RX processing unit P1r, may be configured to modify an amplitude of the input signal to the RX weighting circuit M2r based on the real number. When the second RX weight is a complex number, applying the second RX weight to the input signal to the RX weighting circuit M2r may be configured to modify the amplitude of the input signal to the RX weighting circuit M2r based on a real portion of the complex number and configured to modify a phase of the input signal to the RX weighting circuit M2r based on a complex portion of the complex number.

In the embodiments of the RF system 200 where both the delay circuit D2 and the RX weighting circuit M2r are implemented in the second digital loopback circuit 230-2, the RX signal indicative of the output of the RX processing unit P1r that is provided to the second combiner C2 via the second loopback path may be the output M2r' of the RX weighting circuit M2r, which was generated by the RX weighting circuit M2r based on the output D2' of the delay circuit D2. In such embodiments the second loopback path may include a communication path between the RX processing unit P1r and the delay circuit D2, between the delay circuit D2 and the RX weighting circuit M2r, and between the RX weighting circuit M2r and the combiner C2, as shown in FIG. 2. In other embodiments of the RF system 200 where both the delay circuit D2 and the RX weighting circuit M2r are implemented in the second digital loopback circuit 230-2, the order of the delay circuit D2 and the RX weighting circuit M2r may be interchanged compared to what is shown in FIG. 2. In such embodiments, the RX signal indicative of the output of the RX processing unit P1r that is provided to the second combiner C2 via the second loopback path may be the output D2' of the delay circuit D2, which was generated by the delay circuit D2 based on the output M2r' of the RX weighting circuit M2r. In such embodiments the second loopback path may include a communication path between the RX processing unit P1r and the RX weighting circuit M2r, between the RX weighting circuit M2r and the delay circuit D2, and between the delay circuit D2 and the combiner C2.

The digital loopback circuits 230 are programmable in that one or more parameters used by the circuits may be varied to change whether and which signals are fed back from the RX path to the TX path and whether and how the signals fed back from the RX path to the TX path are processed in the TX path. In some embodiments, the controller 240 may be implement or control such programmability. For example, in various embodiments, the controller 240 may be configured to control operation of one or more of the combiners C1, C2 (e.g., by selecting what kind of combination of the RX and TX signals each of these combiners is supposed to implement), the TX weighting circuits M1t, M2t (e.g., by selecting the weights applied by each of these circuits in the TX path), the RX weighting circuits M1r, M2r (e.g., by selecting the weights applied by each of these circuits in the RX path), and the delay circuits D1, D2 (e.g., by selecting the delay applied by each of these circuits). Thus, the controller 240 may be configured to control operation of the digital loopback circuits 230 by setting operating parameters (e.g., the weights, delay times, etc.) of one or more of the combiners C1, C2, the TX weighting circuits M1t, M2t, the RX weighting circuits M1r, M2r, and the delay circuits D1, D2. In some embodiments, the controller 240 may be configured to set the operating parameters based on user input provided to the controller 240, e.g., via a user interface (described with reference to the data processing system of FIG. 5). In some embodiments, the controller 240 may be configured to set the operating parameters based on the mode of operation of the RF system 200, e.g., based on for what purpose the digital loopback circuits 230 are being used, based on the type of the TX and the RX signals transmitted and received by the RF system 200, based on how quickly the processing units are able to process the input signals provided thereto, etc. In some embodiments, the controller 240 may be configured to set the operating parameters based on a predefined program as to how the programmability of the digital loopback circuits 230 is to be implemented. In still further embodiments, the controller 240 may be configured to set the operating parameters based on two or more of the considerations described above.

Figure 3:
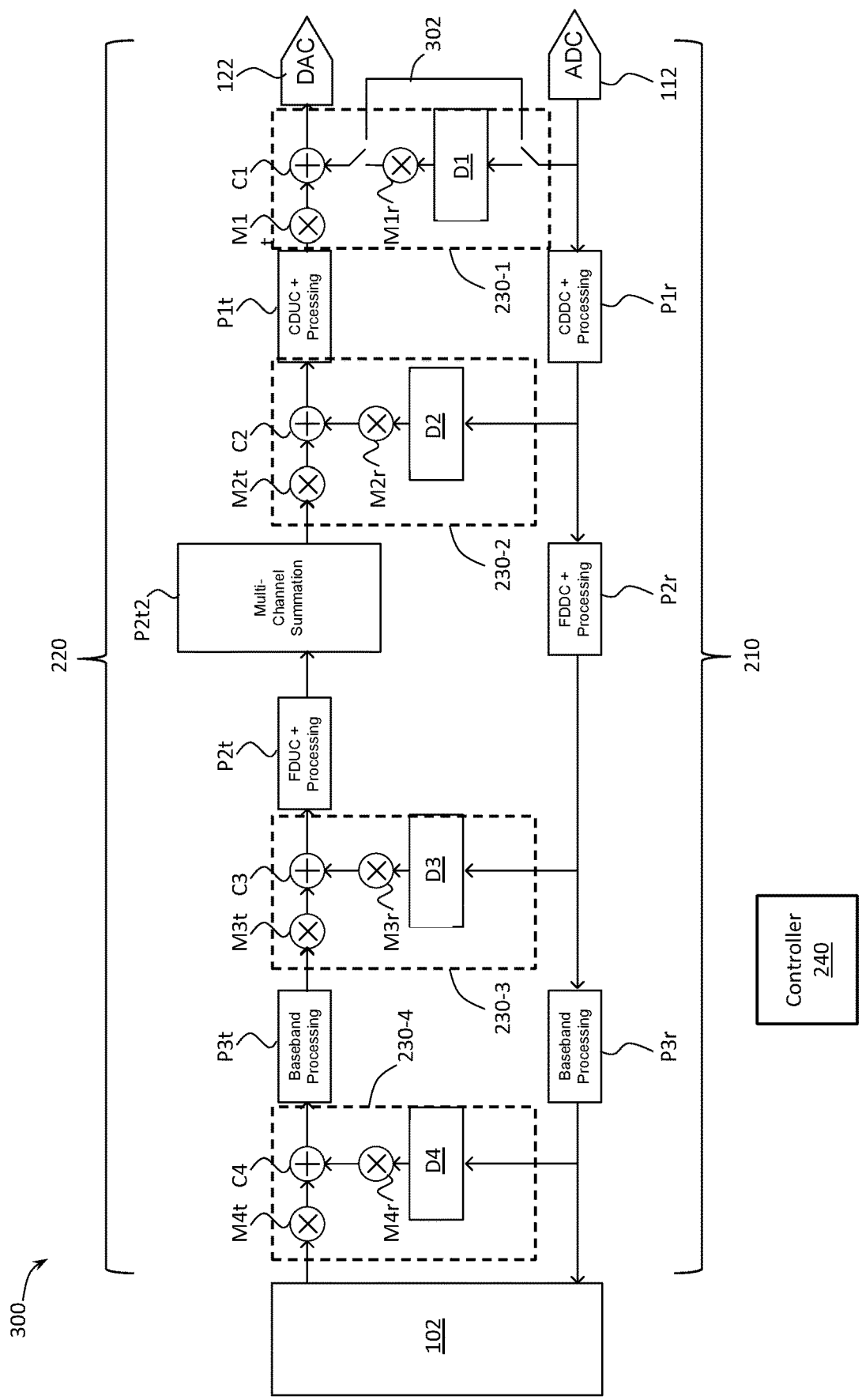
FIG. 3 provides a schematic block diagram of an example RF system with a plurality of programmable digital loopback circuits and specific processing blocks, according to some embodiments of the present disclosure.

While the RF system 200 has been described with reference to two programmable digital loopback circuits 230, in further embodiments, any other number of programmable digital loopback circuits 230 similar to those described above may be implemented in such a system. One example is shown in FIG. 3, providing a schematic block diagram of an example RF system 300 with a plurality of programmable digital loopback circuits and specific processing blocks, according to some embodiments of the present disclosure. The RF system 300 is an example of the RF system 200 where four programmable digital loopback circuits 230 are implemented, labeled as circuits 230-1 through 230-4. In FIG. 3, elements labeled with the same reference numerals (including a combination of reference letters and numerals, e.g., P1t, P1r, C1, C2, etc.) are intended to illustrate analogous or the same elements to those described above so that their descriptions provided with reference to FIG. 2 are not repeated with reference to FIG. 3 and only the differences or additional features are described. Similarly, FIG. 3 uses the same notation to describe various components of the programmable digital loopback circuits 230-3 and 230-4 as those that were used for the programmable digital loopback circuits 230-1 and 230-2 shown in FIG. 2, except that the reference numbers are changed to "3" for the programmable digital loopback circuit 230-3 and to "4" for the programmable digital loopback circuit 230-4.

The RF system 200 shown in FIG. 2 was described with reference to one pair of processing units in the RX and the TX paths, namely, a pair of the processing units P1r and P1t, where digital loopback circuits 230-1 and 230-2 were provided after and before the pair (the terms "after" and "before" used in this context with reference to the TX path). As shown in FIG. 3, the RF system 300 may include three such pairs of processing units in the RX and the TX paths. The first pair of the RX and TX processing units of the RF system 300 includes the processing units P1r and P1t, respectively, as described above, with the digital loopback circuits 230-1 and 230-2 provided after and before the first pair. The second pair of the RX and TX processing units of the RF system 300 includes the processing units P2r and P2t, respectively, similar to the first pair described above, but now with the digital loopback circuits 230-2 and 230-3 provided after and before the second pair. The third pair of the RX and TX processing units of the RF system 300 includes the processing units P3r and P3t, respectively, similar to the first pair described above, but now with the digital loopback circuits 230-3 and 230-4 provided after and before the third pair. For the example shown in FIG. 3, the different pairs of the RX and TX processing units are used to perform DSP at different levels of down- or up-conversion of the RX and TX signals. As shown in FIG. 3, in some embodiments, the first pair of the processing units P1r and P1t may be configured to perform coarse DDC and DUC processing of the signals (namely, the RX processing unit P1r is configured to perform coarse DDC (CDDC) of the RX signal and the TX processing unit P1t is configured to perform coarse DUC (CDUC) of the TX signal). On the other hand, in some embodiments, the second pair of the processing units P2r and P2t may be configured to perform fine DDC and DUC processing of the signals (namely, the RX processing unit P2r is configured to perform fine DDC (FDDC) of the RX signal and the TX processing unit P2t is configured to perform fine DUC (FDUC) of the TX signal). In some embodiments, the coarse and fine DDC/DUC may be coordinated between one another in order to carry out the desired downconversion/upconversion operation. In some embodiments, in the digital upconversion or downconversion, modulation can be applied on the NCO in that results in modulation being applied to the loopback data. In various embodiments, options for modulation include one or more of frequency shifts, frequency or phase modulation onto the signal, or linear frequency modulation across a pulse train received and sent back. The modulation can be different in each processing unit, resulting in multiple replicas of the received signal retransmitted each with different modulation applied. The third pair of the processing units P3r and P3t may be configured to perform baseband processing of the signals (namely, the RX processing unit P3r is configured to perform baseband processing of the RX signal and the TX processing unit P3t is configured to perform baseband processing of the TX signal), such as applying direct modulation functions on the I/Q baseband data. In some embodiments, the baseband processing may include some kind of application-specific processing. For example, in some embodiments, for communications systems this could be the conversion of bits to waveforms on the TX side (e.g., modulation, pulse shaping, error correction coding, etc.) or conversion of waveforms to bits on the RX side (e.g., demodulation, matched filtering, error correction, etc.). One example could be the case of the communications repeater. In some repeaters the loopback of signals may be performed on the signal waveforms with minimal filtering or other processing to minimize the latency. For other systems, the data may be extensively filtered and demodulated before being re-modulated and transmitted to provide a high level of signal quality. For RADAR systems this could include the RADAR pulse generation for the TX path, and the determination of one or more of distance, velocity and other parameters on the RX path. In a RADAR system the loopback path could be used to simultaneously act as a signal jammer or to create false images for other systems.

Each of the TX weighting circuits M3$t$ and M4$t$ may be implemented similar to the TX weighting circuit M2$t$, while each of the RX weighting circuits M3$r$ and M4$r$ may be implemented similar to the RX weighting circuit M2$r$, described above. Similarly, the combiners C3 and C4 may be implemented similar to the combiner C2, while the delay circuits D3 and D4 may be implemented similar to the delay circuit D2, described above.

FIG. 3 further illustrates an additional TX processing unit P2$t$2, configured to receive as an input one or more signals based on the output of the TX processing unit P2$t$, and provide an output that forms basis for the input for the TX weighting circuit M2$t$. The TX processing unit P2$t$2 may be included in such embodiments of the RF system 300 where TX signals may include components of different carriers (i.e., signals in different frequency bands), which may also be referred to as different channels. For example, in some implementations, the RF system 300 may be configured to process 4 carriers of having about 100 MHz frequency separation between the carriers. In such embodiments, processing in the transmitter 220 before the TX processing unit P2$t$2 may be performed on a per-carrier basis (i.e., different for different channels or carriers), then the TX processing unit P2$t$2 may be configured to combine the output signals from the TX processing unit P2$t$ for each of the channels to form a combined signal that is then provided as an input to the TX weighting circuit M2$t$.

FIG. 3 also illustrates that, in some embodiments, the RF system 300 may include a bypass 302 configured to bypass the delay circuit D1 and the RX weighting circuit M1$r$, which may sometimes be desirable to achieve the lowest latency of the digital loopback processing. The controller 240 may be configured to control when the bypass 302 is engaged (i.e., the delay circuit D1 and the RX weighting circuit M1$r$ are bypassed and the output of the ADC 112 is provided to the combiner C1 directly), or when the bypass 302 is disengaged.

Figure 4:
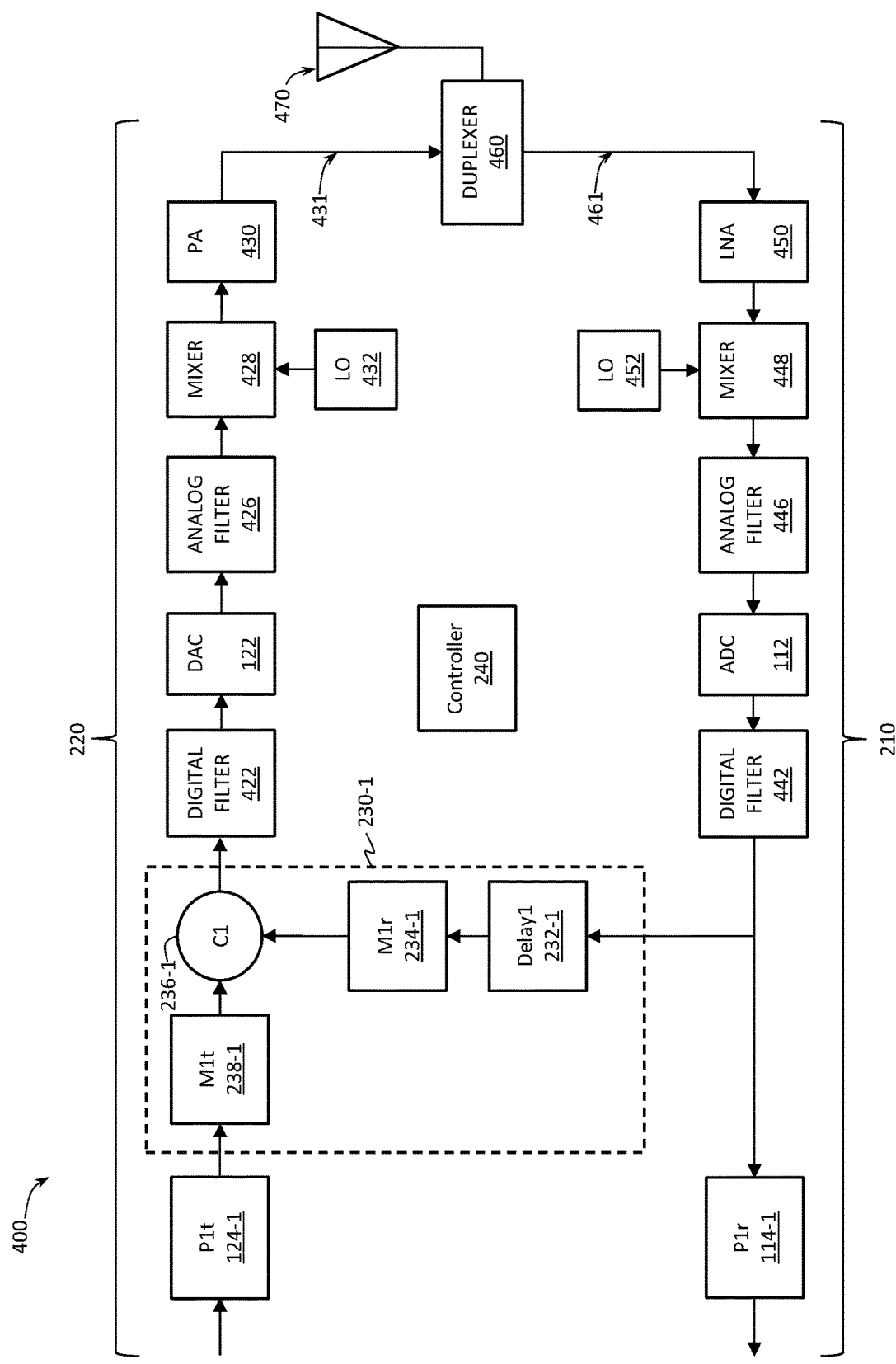
FIG. 4 provides a schematic block diagram illustrating example details of the receiver and the transmitter of an example RF system in which one or more programmable digital loopback circuits may be implemented, according to some embodiments of the present disclosure.

FIG. 4 provides a schematic block diagram illustrating example details of the RX and the transmitters of an example RF system 400 in which one or more programmable digital loopback circuits may be implemented, according to some embodiments of the present disclosure. The RF system 400 shown in FIG. 4 is one example implementation of the RF system 200 or the RF system 300, where the same reference numerals as described above refer to the same or analogous elements/components so that descriptions provided with respect to one of these figures are assumed to be applicable and do not have to be repeated for the other, and only the differences are described.

As shown in FIG. 4, in some embodiments, the transmitter 220 may include a digital filter 422, an analog filter 426, a mixer 428, a power amplifier (PA) 430, and a LO 432. In such a transmitter, a TX signal may be filtered in the digital domain by the digital filter 422 to generate a filtered input, a digital signal. The output of the digital filter 422 may then be converted to an analog signal by the DAC 122. The analog signal generated by the DAC 122 may then be filtered by the analog filter 426. The output of the analog filter 426 may then be upconverted to RF by the mixer 428, which may receive a signal from the LO 432 to translate the filtered analog signal from the analog filter 426 from baseband or IF to RF. The PA 430, which may be a PA array in some embodiments, may be configured to amplify the RF signal generated by the transmitter 220 (e.g., the RF signal generated by the mixer 428) and provide an amplified RF signal to the antenna 470 to be wirelessly transmitted (possibly via a duplexer 460, as shown in FIG. 4).

Besides what is shown in FIG. 4, other embodiments of implementing the transmitter 220 are also possible and within the scope of the present disclosure. For instance, in another implementation (not illustrated in the present drawings) the output of the digital filter 422 can be directly converted to an RF signal by the DAC 122. In such an implementation, the RF signal provided by the DAC 122 can then be filtered by the analog filter 426. Since the DAC 122 would directly synthesize the RF signal in this implementation, the mixer 428 and the LO 432 illustrated in FIG. 4 can be omitted from the transmitter circuit 220 in such embodiments.

As further shown in FIG. 4, in some embodiments, the receiver 210 may include a digital filter 442, an analog filter 446, a mixer 448, an LNA 450, and a LO 452. The LNA 450 may receive a RX signal as an input. To that end, an input of the LNA 450 may be coupled to an output port of the antenna 470 (possibly via the duplexer 460). In some embodiments, the antenna 470 may receive RF signals in different bands, and the LNA 450 may amplify the received RF signals. Although not specifically shown in FIG. 4, the LNA 450 may be coupled to the harmonic or band-pass filter that may filter received RF signals that have been amplified by the LNA 450 and output by the LNA 450. The output of the LNA 450 may be downconverted to the baseband by the mixer 448, which may receive a signal from the LO 452 (which may be the same or different from the LO 432) to translate the input RX signal from the RF to the baseband. The output of the mixer 448 may then be filtered by the analog filter 446. The output of the analog filter 446 may then be converted to a digital signal by the ADC 112. The digital signal generated by the ADC 112 may then be filtered in the digital domain by the digital filter 442 to generate a filtered downconverted signal, which may be a sequence of digital values indicative of the RF signal received by the antenna 470.

Besides what is shown in FIG. 4, other embodiments of implementing the receiver 210 are also possible and within the scope of the present disclosure. For instance, in another implementation (not illustrated in the present drawings) the RX signal can be directly converted to a baseband signal by the ADC 112. In such an implementation, the downconverted signal provided by the ADC 112 can then be filtered by the digital filter 442. Since the ADC 112 would directly synthesize the baseband signal in this implementation, the mixer 448 and the LO 452 illustrated in FIG. 4 can be omitted from the receiver circuit 210 in such embodiments.

Further variations are possible to the RF system 400 described above. For example, while upconversion and downconversion is described with respect to the baseband frequency, in other embodiments of the communication system 400, an IF may be used instead. In another example, although a single path mixer is shown in each of the TX path (i.e., the signal path for the signal to be processed by the transmitter 220) and the RX path (i.e., the signal path for the signal to be processed by the receiver 210) of the RF system 400, in some embodiments, the TX path mixer 428 and the RX path mixer 448 may be implemented as a quadrature upconverter and downconverter, respectively, in which case each of them would include a first mixer and a second mixer. For example, for the RX path mixer 448, the first RX path mixer may be configured for performing downconversion to generate an in-phase (I) downconverted RX signal by mixing the RX signal and an in-phase component of the LO signal provided by the LO 452. The second RX path mixer may be configured for performing downconversion to generate a quadrature (Q) downconverted RX signal by mixing the RX signal and a quadrature component of the LO signal provided by the LO 452 (the quadrature component is a component that is offset, in phase, from the in-phase component of the LO signal by 90 degrees). The output of the first RX path mixer may be provided to a I-signal path, and the output of the second RX path mixer may be provided to a Q-signal path, which may be substantially 90 degrees out of phase with the I-signal path.

Example Data Processing System

Figure 5:
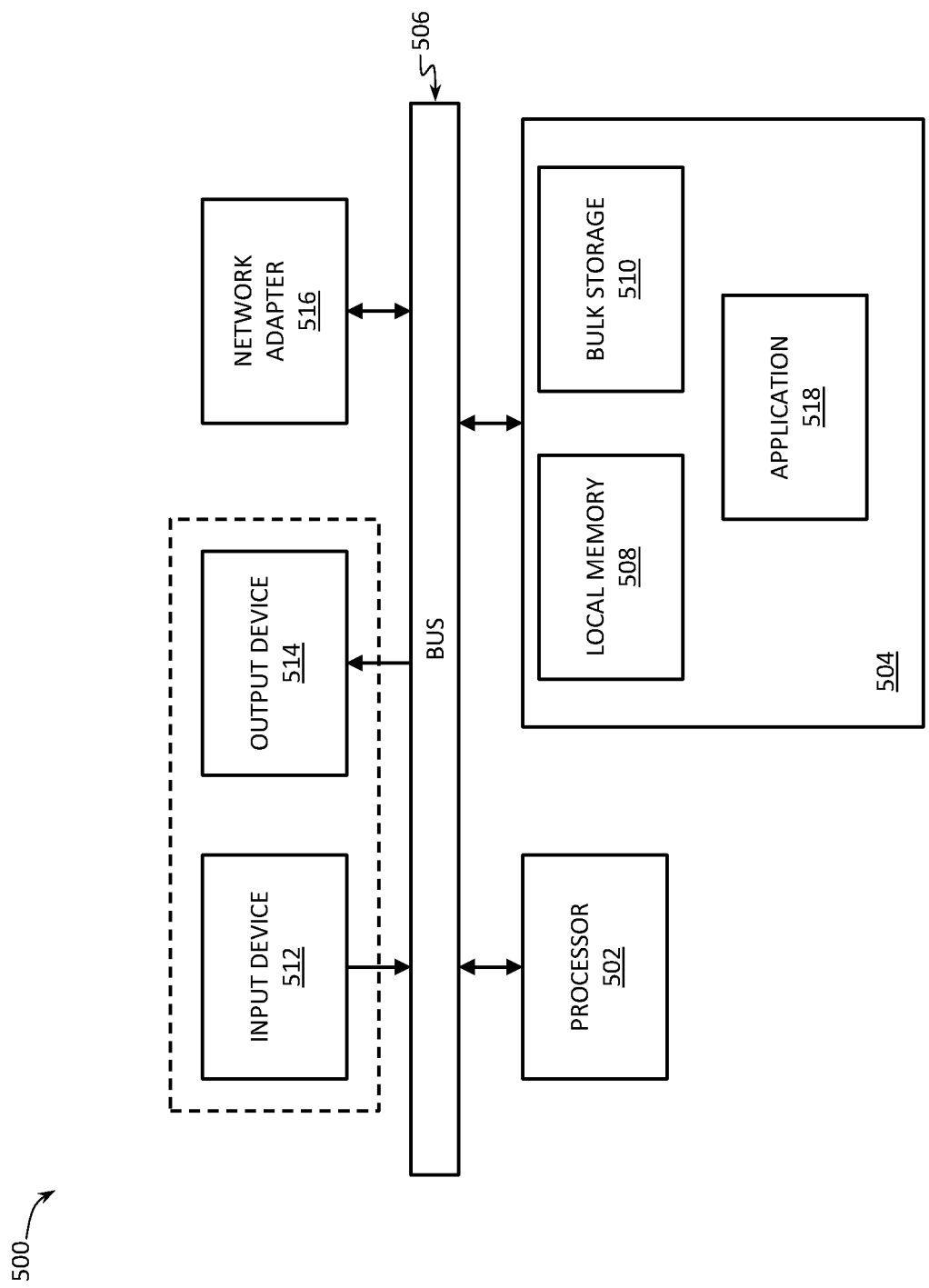
FIG. 5 provides a schematic block diagram of an example data processing system that may be configured to implement, or control implementation of, at least portions of programmable digital loopback in a system, according to some embodiments of the present disclosure.

FIG. 5 provides a schematic block diagram of an example data processing system 500 that may be configured to implement, or control implementation of, at least portions of programmable digital loopback in a system, according to some embodiments of the present disclosure. For example, the data processing system 500 may be used to implement at least portions of the RF system as described with reference to FIGS. 2-4, in particular, to implement at least portions of any of the programmable digital loopback circuits 230, described herein.

As shown in FIG. 5, the data processing system 500 may include at least one processor 502, e.g. a hardware processor 502, coupled to memory elements 504 through a system bus 506. As such, the data processing system may store program code within memory elements 504. Further, the processor 502 may execute the program code accessed from the memory elements 504 via a system bus 506. In one aspect, the data processing system may be implemented as a computer that is suitable for storing and/or executing program code. It should be appreciated, however, that the data processing system 500 may be implemented in the form of any system including a processor and a memory that is capable of performing the functions described within this disclosure.

In some embodiments, the processor 502 can execute software or an algorithm to perform the activities as discussed in this specification, in particular activities related to programmable digital loopback, such as various techniques implemented by the digital loopback circuits 230 described herein. The processor 502 may include any combination of hardware, software, or firmware providing programmable logic, including by way of non-limiting example a microprocessor, a DSP, a field-programmable gate array (FPGA), a programmable logic array (PLA), an integrated circuit (IC), an application-specific IC (ASIC), or a virtual machine processor. The processor 502 may be communicatively coupled to the memory element 504, for example in a direct-memory access (DMA) configuration, so that the processor 502 may read from or write to the memory elements 504.

In general, the memory elements 504 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 500 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 2-4, can also include suitable interfaces for receiving, transmitting, and/or otherwise communicating data or information in a network environment so that they can communicate with, e.g., the data processing system 500 of another one of these elements.

In certain example implementations, mechanisms for implementing programmable digital loopback circuits in RF transceivers as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 504 shown in FIG. 5, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 502 shown in FIG. 5, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 504 may include one or more physical memory devices such as, for example, local memory 508 and one or more bulk storage devices 510. The local memory may refer to RAM or other non-persistent memory device(s) generally used during actual execution of the program code. A bulk storage device may be implemented as a hard drive or other persistent data storage device. The processing system 500 may also include one or more cache memories (not shown) that provide temporary storage of at least some program code in order to reduce the number of times program code must be retrieved from the bulk storage device 510 during execution.

As shown in FIG. 5, the memory elements 504 may store an application 518. In various embodiments, the application 518 may be stored in the local memory 508, the one or more bulk storage devices 510, or apart from the local memory and the bulk storage devices. It should be appreciated that the data processing system 500 may further execute an operating system (not shown in FIG. 5) that can facilitate execution of the application 518. The application 518, being implemented in the form of executable program code, can be executed by the data processing system 500, e.g., by the processor 502. Responsive to executing the application, the data processing system 500 may be configured to perform one or more operations to implement programmable digital loopback described herein.

Input/output (I/O) devices depicted as an input device 512 and an output device 514, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 514 may be any type of screen display, such as plasma display, liquid crystal display (LCD), organic light emitting diode (OLED) display, electroluminescent (EL) display, or any other indicator, such as a dial, barometer, or light emitting diode (LED). In some implementations, the system may include a driver (not shown) for the output device 514. Input and/or output devices 512, 514 may be coupled to the data processing system either directly or through intervening I/O controllers.

In an embodiment, the input and the output devices may be implemented as a combined input/output device (illustrated in FIG. 5 with a dashed line surrounding the input device 512 and the output device 514). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 516 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 500, and a data transmitter for transmitting data from the data processing system 500 to said systems, devices and/or networks. Modems, cable modems, and Ethernet cards are examples of different types of network adapter that may be used with the data processing system 500.

Example Device

Figure 6:
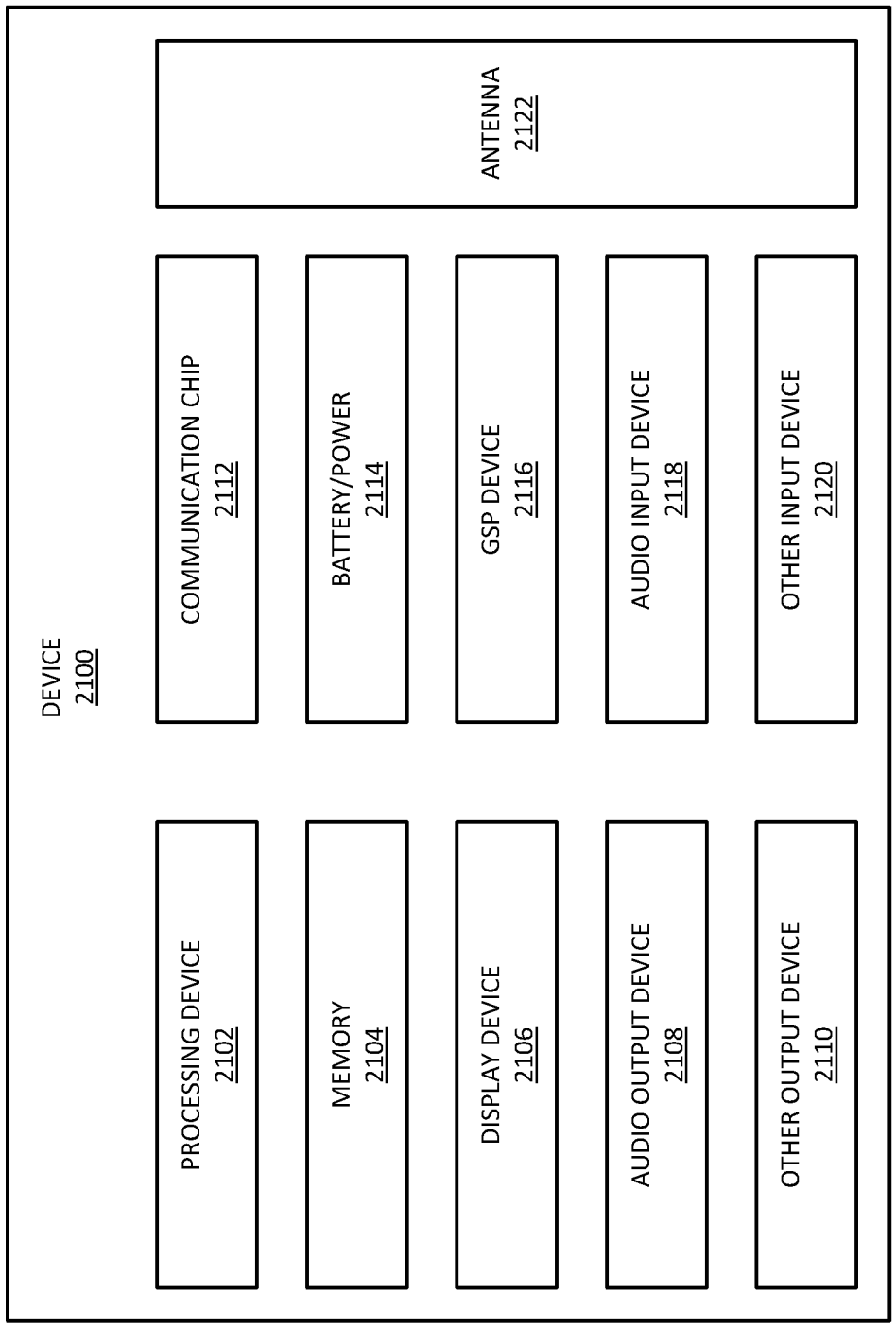
FIG. 6 is a block diagram of an example electrical device that may include one or more RF systems with a plurality of programmable digital loopback circuits, according to some embodiments of the present disclosure.

FIG. 6 is a block diagram of an example electrical device that may include one or more RF systems with a plurality of programmable digital loopback circuits, according to some embodiments of the present disclosure. For example, any suitable ones of the components of the electrical device 2100 may include one or more of the RF systems/components with a plurality of programmable digital loopback circuits as disclosed herein. A number of components are illustrated in FIG. 6 as included in the electrical device 2100, but any one or more of these components may be omitted or duplicated, as suitable for the application. In some embodiments, some or all of the components included in the electrical device 2100 may be attached to one or more motherboards. In some embodiments, some or all of these components are fabricated onto a single system-on-a-chip (SOC) die.

Additionally, in various embodiments, the electrical device 2100 may not include one or more of the components illustrated in FIG. 6, but the electrical device 2100 may include interface circuitry for coupling to the one or more components. For example, the electrical device 2100 may not include a display device 2106, but may include display device interface circuitry (e.g., a connector and driver circuitry) to which a display device 2106 may be coupled. In another set of examples, the electrical device 2100 may not include an audio input device 1818 or an audio output device 2108, but may include audio input or output device interface circuitry (e.g., connectors and supporting circuitry) to which an audio input device 1818 or audio output device 2108 may be coupled.

The electrical device 2100 may include a processing device 2102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2102 may include one or more DSPs, application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2100 may include a memory 2104, which may itself include one or more memory devices such as volatile memory (e.g., dynamic RAM (DRAM)), non-volatile memory (e.g., ROM), flash memory, solid state memory, and/or a hard drive. In some embodiments, the memory 2104 may include memory that shares a die with the processing device 2102. This memory may be used as cache memory and may include embedded DRAM (eDRAM) or spin transfer torque magnetic RAM (STT-M RAM).

In some embodiments, the electrical device 2100 may include a communication chip 2112 (e.g., one or more communication chips). For example, the communication chip 2112 may be configured for managing wireless communications for the transfer of data to and from the electrical device 2100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2112 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2112 may operate in accordance with other wireless protocols in other embodiments. The electrical device 2100 may include an antenna 2122 to facilitate wireless communications and/or to receive other wireless communications (such as AM or FM radio transmissions).

In some embodiments, the communication chip 2112 may manage wired communications, such as electrical, optical, or any other suitable communication protocols (e.g., the Ethernet). As noted above, the communication chip 2112 may include multiple communication chips. For instance, a first communication chip 2112 may be dedicated to shorter-range wireless communications such as Wi-Fi or Bluetooth, and a second communication chip 2112 may be dedicated to longer-range wireless communications such as global positioning system (GPS), EDGE, GPRS, CDMA, WiMAX, LTE, EV-DO, or others. In some embodiments, a first communication chip 2112 may be dedicated to wireless communications, and a second communication chip 2112 may be dedicated to wired communications.

The electrical device 2100 may include battery/power circuitry 2114. The battery/power circuitry 2114 may include one or more energy storage devices (e.g., batteries or capacitors) and/or circuitry for coupling components of the electrical device 2100 to an energy source separate from the electrical device 2100 (e.g., AC line power).

The electrical device 2100 may include a display device 2106 (or corresponding interface circuitry, as discussed above). The display device 2106 may include any visual indicators, such as a heads-up display, a computer monitor, a projector, a touchscreen display, an LCD, an LED display, or a flat panel display.

The electrical device 2100 may include an audio output device 2108 (or corresponding interface circuitry, as discussed above). The audio output device 2108 may include any device that generates an audible indicator, such as speakers, headsets, or earbuds.

The electrical device 2100 may include an audio input device 2118 (or corresponding interface circuitry, as discussed above). The audio input device 2118 may include any device that generates a signal representative of a sound, such as microphones, microphone arrays, or digital instruments (e.g., instruments having a musical instrument digital interface (MIDI) output).

The electrical device 2100 may include a GPS device 2116 (or corresponding interface circuitry, as discussed above). The GPS device 2116 may be in communication with a satellite-based system and may receive a location of the electrical device 2100, as known in the art.

The electrical device 2100 may include another output device 2110 (or corresponding interface circuitry, as discussed above). Examples of the other output device 2110 may include an audio codec, a video codec, a printer, a wired or wireless transmitter for providing information to other devices, or an additional storage device.

The electrical device 2100 may include another input device 2120 (or corresponding interface circuitry, as discussed above). Examples of the other input device 2120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2100 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 2100 may be any other electronic device that processes data.

Select Examples

The following paragraphs provide various examples of the embodiments disclosed herein.

Example 1 provides an apparatus for implementing digital loopback for an RF system. The apparatus includes a receiver (110), including an ADC (112) and a first receive (RX) processing unit (114-1). The apparatus also includes a transmitter (120), including a digital-to-analog (DAC) (122) and a first transmit (TX) processing unit (124-1, P1$t$). The apparatus further includes a first digital loopback circuit (230-1) and a second digital loopback circuit (230-2). The first digital loopback circuit includes a first loopback path, a first combiner (236-1), and a first TX weighting circuit (238-1), where the first loopback path is configured to provide a signal indicative of an output of the ADC to the first combiner, the first TX weighting circuit is configured to apply a first TX weight to an output of the first TX processing unit (124-1) to generate a weighted output of the first TX processing unit, and the first combiner is configured to combine a first RX signal and a first TX signal to generate a first combined signal to be provided to the DAC, where the first RX signal is a signal indicative of the output of the ADC, received over the first loopback path, and the first TX signal is a signal indicative of the weighted output of the first TX processing unit, received from the first transmitter weighting circuit. The second digital loopback circuit includes a second loopback path, a second combiner (236-2), and a second TX weighting circuit (238-2), where the second loopback path is configured to provide a signal indicative of an output of the first RX processing unit (114-1, P1$r$) to the second combiner, the second TX weighting circuit is configured to apply a second TX weight to a signal indicative of an input digital signal to generate a weighted input for the first TX processing unit (124-1), the second combiner is configured to combine a second RX signal and a second TX signal to generate a second combined signal to be provided to the first TX processing unit, where the second RX signal is a signal indicative of the output of the first RX processing unit, received over the second loopback path, and the second TX signal is a signal indicative of the weighted input for the first TX processing unit, received from the second transmitter weighting circuit, and the first TX processing unit is configured to generate the output of the first TX processing unit based on the second combined signal.

Example 2 provides the apparatus according to example 1, where the first combiner is configured to add the first RX signal and the first TX signal, or the first combiner is configured to perform a nonlinear combination of the first RX signal and the first TX signal. Analogous applies to the second combiner, and whichever additional combiners may be included in the apparatus.

Example 3 provides the apparatus according to examples 1 or 2, where the first TX weight is a value by which the first TX weighting circuit multiplies the output of the first TX processing unit to generate the weighted output of the first TX processing unit, where when the first TX weight is a real number, applying the first TX weight to the output of the first TX processing unit is configured to modify an amplitude of the output of the first TX processing unit based on the real number, and when the first TX weight is a complex number, applying the first TX weight to the output of the first TX processing unit is configured to modify the amplitude of the output of the first TX processing unit based on a real portion of the complex number and configured to modify a phase of the output of the first TX processing unit based on a complex portion of the complex number. Analogous applies to the second TX weight, and whichever additional TX weights may be used in the apparatus.

Example 4 provides the apparatus according to any one of the preceding examples, where the first digital loopback circuit further includes a first RX weighting circuit (234-1), configured to apply a first RX weight to a signal indicative of the output of the ADC to generate the first RX signal that is used by the first combiner to combine with the first TX signal, and/or the second digital loopback circuit further includes a second RX weighting circuit (234-2), configured to apply a second RX weight to a signal indicative of the output of the first RX processing unit to generate the second RX signal that is used by the second combiner to combine with the second TX signal.

Example 5 provides the apparatus according to example 4, where the first RX weight is a value by which the first RX weighting circuit multiplies the signal indicative of the output of the ADC to generate the first RX signal, where when the first RX weight is a real number, applying the first RX weight to the signal indicative of the output of the ADC is configured to modify an amplitude of the signal indicative of the output of the ADC based on the real number, and when the first RX weight is a complex number, applying the first RX weight to the signal indicative of the output of the ADC is configured to modify the amplitude of the signal indicative of the output of the ADC based on a real portion of the complex number and configured to modify a phase of the signal indicative of the output of the ADC based on a complex portion of the complex number. Analogous applies to the second RX weight, and whichever additional RX weights may be used in the apparatus.

Example 6 provides the apparatus according to any one of the preceding examples, where the first digital loopback circuit further includes a first RX delay circuit (232-1), configured to apply a first RX delay to a signal indicative of the output of the ADC to generate the first RX signal that is used by the first combiner to combine with the first TX signal, and/or the second digital loopback circuit further includes a second RX delay circuit (232-2), configured to apply a second RX delay to a signal indicative of the output of the first RX processing unit to generate the second RX signal that is used by the second combiner to combine with the second TX signal.

Example 7 provides the apparatus according to any one of the preceding examples, where the first RX signal is one of a plurality of first RX signals received over different channels, and the first combiner is configured to combine the plurality of first RX signals and the first TX signal to generate the first combined signal, and/or the second RX signal is one of a plurality of second RX signals received over different channels, and the second combiner is config-ured to combine the plurality of second RX signals and the second TX signal to generate the second combined signal.

Example 8 provides the apparatus according to any one of the preceding examples, where the first TX signal is one of a plurality of first TX signals received over different channels, and the first combiner is configured to combine the plurality of first TX signals and the first RX signal to generate the first combined signal, and/or the second TX signal is one of a plurality of second TX signals received over different channels, and the second combiner is configured to combine the plurality of second TX signals and the second RX signal to generate the second combined signal.

Example 9 provides the apparatus according to any one of the preceding examples, further including a controller, configured to control operation of one or more of the first combiner, the first TX weighting circuit, the first RX weighting circuit, the first RX delay circuit, the second combiner, the second TX weighting circuit, the second RX weighting circuit, and the second RX delay circuit.

Example 10 provides the apparatus according to any one of the preceding examples, where the first RX processing unit is configured to apply one or more of a frequency shift, a frequency modulation, an amplitude modulation, a phase modulation, or a linear frequency modulation applied to a pulse train of an input signal provided to the first RX processing unit to generate the output of the first RX processing unit.

Example 11 provides the apparatus according to any one of the preceding examples, where the first TX processing unit is configured to apply one or more of a frequency shift, a frequency modulation, an amplitude modulation, a phase modulation, or a linear frequency modulation applied to a pulse train of an input signal provided to the first TX processing unit to generate the output of the first TX processing unit.

In the digital upconversion or downconversion, modulation can be applied on the NCO in that results in modulation being applied to the loopback data. In various embodiments, options for modulation include one or more of frequency shifts, frequency or phase modulation onto the signal, or linear frequency modulation across a pulse train received and sent back. The modulation can be different in each processing unit, resulting in multiple replicas of the received signal retransmitted each with different modulation applied.

Example 12 provides the apparatus according to any one of the preceding examples, where the transmitter further includes a TX digital filter, and the first combined signal being provided to the DAC includes providing a signal indicative of the first combined signal to the TX digital filter and providing a signal indicative of an output of the TX digital filter to the DAC.

Example 13 provides the apparatus according to any one of the preceding examples, where the receiver further includes a RX digital filter, the RX digital filter is configured to generate an output of the RX digital filter based on the output of the ADC, and the first RX signal is a signal indicative of the output of the RX digital filter.

Example 14 provides the apparatus according to any one of the preceding examples, where the ADC, the DAC, the first RX processing unit, the first TX processing unit, the first digital loopback circuit, and the second digital loopback circuit are integrated on a single die.

Example 15 provides the apparatus according to any one of examples 1-14, where the apparatus is an RF converter.

Example 16 provides the apparatus according to any one of examples 1-14, where the apparatus is a transmit signal front end device.

Example 17 provides the apparatus according to any one of examples 1-14, where the apparatus is an RF transceiver.

Example 18 provides an RF system that includes a receiver, including a receive (RX) DSP chain; a transmitter, including a transmit (TX) DSP chain; and a plurality of digital loopback circuits, configured to generate weighted combinations of RX signals from different points of the RX DSP chain and TX signals from different points of the TX DSP chain for generating signals to be transmitted by the transmitter.

Example 19 provides the RF system according to example 18, where the RX DSP chain includes an ADC (112) and a first receive (RX) processing unit (114-1), the TX DSP chain includes a digital-to-analog (DAC) (122) and a first transmit (TX) processing unit (124-1, P1$t$), and the plurality of digital loopback circuits includes a first digital loopback circuit (230-1) and a second digital loopback circuit (230-2). The first digital loopback circuit includes a first loopback path, a first combiner (236-1), and a first TX weighting circuit (238-1), where the first loopback path is configured to provide a signal indicative of an output of the ADC to the first combiner, the first TX weighting circuit is configured to apply a first TX weight to an output of the first TX processing unit (124-1) to generate a weighted output of the first TX processing unit, and the first combiner is configured to combine a first RX signal and a first TX signal to generate a first combined signal to be provided to the DAC, where the first RX signal is a signal indicative of the output of the ADC, received over the first loopback path, and the first TX signal is a signal indicative of the weighted output of the first TX processing unit, received from the first transmitter weighting circuit. The second digital loopback circuit includes a second loopback path, a second combiner (236-2), and a second TX weighting circuit (238-2), where the second loopback path is configured to provide a signal indicative of an output of the first RX processing unit (114-1, P1$r$) to the second combiner, the second TX weighting circuit is configured to apply a second TX weight to a signal indicative of an input digital signal to generate a weighted input for the first TX processing unit (124-1), the second combiner is configured to combine a second RX signal and a second TX signal to generate a second combined signal to be provided to the first TX processing unit, where the second RX signal is a signal indicative of the output of the first RX processing unit, received over the second loopback path, and the second TX signal is a signal indicative of the weighted input for the first TX processing unit, received from the second transmitter weighting circuit, and the first TX processing unit is configured to generate the output of the first TX processing unit based on the second combined signal.

Example 20 provides a method of operating an RF system for implementing digital loopback, the system including a receiver that includes an ADC and a first receive (RX) processing unit, a transmitter that includes a digital-to-analog (DAC) and a first transmit (TX) processing unit, a first digital loopback circuit that includes a first loopback path, a first combiner, and a first TX weighting circuit, and a second digital loopback circuit that includes a second loopback path, a second combiner, and a second TX weighting circuit. The method includes the first loopback path providing a signal indicative of an output of the ADC to the first combiner; the first TX weighting circuit applying a first TX weight to an output of the first TX processing unit to generate a weighted output of the first TX processing unit; the first combiner combining a first RX signal and a first TX signal to generate a first combined signal to be provided to the DAC, where the first RX signal is a signal indicative of the output of the ADC, received over the first loopback path, and the first TX signal is a signal indicative of the weighted output of the first TX processing unit, received from the first transmitter weighting circuit; the second loopback path providing a signal indicative of an output of the first RX processing unit to the second combiner; the second TX weighting circuit applying a second TX weight to a signal indicative of an input digital signal to generate a weighted input for the first TX processing unit; the second combiner combining a second RX signal and a second TX signal to generate a second combined signal to be provided to the first TX processing unit, where the second RX signal is a signal indicative of the output of the first RX processing unit, received over the second loopback path, and the second TX signal is a signal indicative of the weighted input for the first TX processing unit, received from the second transmitter weighting circuit; and the first TX processing unit generating the output of the first TX processing unit based on the second combined signal.

Variations and Implementations

While embodiments of the present disclosure were described above with references to exemplary implementations as shown in FIGS. 2-6, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as filters, converters, mixers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to programmable digital loopback in various RF communication systems.

Parts of various systems for implementing programmable digital loopback as proposed herein can include electronic circuitry to perform the functions described herein. In some cases, one or more parts of the system can be provided by a processor specially configured for carrying out the functions described herein. For instance, the processor may include one or more application-specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application-specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the RF systems shown in FIGS. 2-4) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to programmable digital loopback as proposed herein illustrate only some of the possible functions that may be executed by, or within, RF communication systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. An apparatus for implementing digital loopback for a radio frequency (RF) system, the apparatus comprising:
   a receiver, comprising an analog-to-digital converter (ADC) and a first receive (RX) processing unit;
   a transmitter, comprising a digital-to-analog (DAC) and a first transmit (TX) processing unit;
   a first loopback circuit, comprising a first loopback path, a first combiner, and a first TX weighting circuit, wherein:
      the first loopback path is configured to provide a signal indicative of an output of the ADC to the first combiner,
      the first TX weighting circuit is configured to apply a first TX weight to an output of the first TX processing unit to generate a weighted output of the first TX processing unit, and
      the first combiner is configured to combine a first RX signal and a first TX signal to generate a first combined signal to be provided to the DAC, where the first RX signal is a signal indicative of the output of the ADC, and the first TX signal is a signal indicative of the weighted output of the first TX processing unit; and
   a second loopback circuit, comprising a second loopback path, a second combiner, and a second TX weighting circuit, wherein:
      the second loopback path is configured to provide a signal indicative of an output of the first RX processing unit to the second combiner,
      the second TX weighting circuit is configured to apply a second TX weight to a signal indicative of an input signal to generate a weighted input for the first TX processing unit,
      the second combiner is configured to combine a second RX signal and a second TX signal to generate a second combined signal to be provided to the first TX processing unit, where the second RX signal is a signal indicative of the output of the first RX processing unit and the second TX signal is a signal indicative of the weighted input for the first TX processing unit, and
      the first TX processing unit is configured to generate the output of the first TX processing unit based on the second combined signal.

2. The apparatus according to claim 1, wherein:
   the first combiner is configured to add the first RX signal and the first TX signal, or
   the first combiner is configured to perform a nonlinear combination of the first RX signal and the first TX signal.

3. The apparatus according to claim 1, wherein the first TX weight is a value by which the first TX weighting circuit multiplies the output of the first TX processing unit to generate the weighted output of the first TX processing unit, where:
   when the first TX weight is a real number, applying the first TX weight to the output of the first TX processing unit is configured to modify an amplitude of the output of the first TX processing unit based on the real number, and
   when the first TX weight is a complex number, applying the first TX weight to the output of the first TX processing unit is configured to modify the amplitude of the output of the first TX processing unit based on a real portion of the complex number and configured to modify a phase of the output of the first TX processing unit based on a complex portion of the complex number.

4. The apparatus according to claim 1, wherein:
   the first loopback circuit further includes a first RX weighting circuit, configured to apply a first RX weight to a signal indicative of the output of the ADC to generate the first RX signal, and/or the second loopback circuit further includes a second RX weighting circuit, configured to apply a second RX weight to a signal indicative of the output of the first RX processing unit to generate the second RX signal.

5. The apparatus according to claim 4, wherein the first RX weight is a value by which the first RX weighting circuit multiplies the signal indicative of the output of the ADC to generate the first RX signal, where:
when the first RX weight is a real number, applying the first RX weight to the signal indicative of the output of the ADC is configured to modify an amplitude of the signal indicative of the output of the ADC based on the real number, and
when the first RX weight is a complex number, applying the first RX weight to the signal indicative of the output of the ADC is configured to modify the amplitude of the signal indicative of the output of the ADC based on a real portion of the complex number and configured to modify a phase of the signal indicative of the output of the ADC based on a complex portion of the complex number.

6. The apparatus according to claim 1, wherein:
the first loopback circuit further includes a first RX delay circuit, configured to apply a first RX delay to a signal indicative of the output of the ADC to generate the first RX signal, and/or
the second loopback circuit further includes a second RX delay circuit, configured to apply a second RX delay to a signal indicative of the output of the first RX processing unit to generate the second RX signal.

7. The apparatus according to claim 1, wherein:
the first RX signal is one of a plurality of first RX signals received over different channels, and the first combiner is configured to combine the plurality of first RX signals and the first TX signal to generate the first combined signal, and/or
the second RX signal is one of a plurality of second RX signals received over different channels, and the second combiner is configured to combine the plurality of second RX signals and the second TX signal to generate the second combined signal.

8. The apparatus according to claim 1, wherein:
the first TX signal is one of a plurality of first TX signals received over different channels, and the first combiner is configured to combine the plurality of first TX signals and the first RX signal to generate the first combined signal, and/or
the second TX signal is one of a plurality of second TX signals received over different channels, and the second combiner is configured to combine the plurality of second TX signals and the second RX signal to generate the second combined signal.

9. The apparatus according to claim 1, further comprising a controller, configured to control operation of one or more of the first combiner, the first TX weighting circuit, the first RX weighting circuit, the first RX delay circuit, the second combiner, the second TX weighting circuit, the second RX weighting circuit, and the second RX delay circuit.

10. The apparatus according to claim 1, wherein the first RX processing unit is configured to apply one or more of a frequency shift, a frequency modulation, an amplitude modulation, a phase modulation, or a linear frequency modulation applied to a pulse train of an input signal provided to the first RX processing unit to generate the output of the first RX processing unit.

11. The apparatus according to claim 1, wherein the first TX processing unit is configured to apply one or more of a frequency shift, a frequency modulation, an amplitude modulation, a phase modulation, or a linear frequency modulation applied to a pulse train of an input signal provided to the first TX processing unit to generate the output of the first TX processing unit.

12. The apparatus according to claim 1, wherein:
the transmitter further includes a TX filter, and
the first combined signal being provided to the DAC includes providing a signal indicative of the first combined signal to the TX filter and providing a signal indicative of an output of the TX filter to the DAC.

13. The apparatus according to claim 1, wherein:
the receiver further includes a RX filter,
the RX filter is configured to generate an output of the RX d filter based on the output of the ADC, and
the first RX signal is a signal indicative of the output of the RX filter.

14. The apparatus according to claim 1, wherein the ADC, the DAC, the first RX processing unit, the first TX processing unit, the first loopback circuit, and the second loopback circuit are integrated on a single die.

15. The apparatus according to claim 1, wherein the apparatus is an RF converter.

16. The apparatus according to claim 1, wherein the apparatus is a transmit signal front end device.

17. The apparatus according to claim 1, wherein the apparatus is an RF transceiver.

18. A method of operating a radio frequency (RF) system for implementing digital loopback, the system including an analog-to-digital converter (ADC), a first receive (RX) processing unit, the method comprising:
applying a first TX weight to an output of the first TX processing unit to generate a weighted output of the first TX processing unit;
combining a first RX signal and a first TX signal to generate a first combined signal to be provided to the DAC, where the first RX signal is a signal indicative of an output of the ADC, and the first TX signal is a signal indicative of the weighted output of the first TX processing unit;
applying a second TX weight to a signal indicative of an input signal to generate a weighted input for the first TX processing unit;
combining a second RX signal and a second TX signal to generate a second combined signal to be provided to the first TX processing unit, where the second RX signal is a signal indicative of an output of the first RX processing unit, and the second TX signal is a signal indicative of the weighted input for the first TX processing unit; and
generating the output of the first TX processing unit based on the second combined signal.

19. The method according to claim 18, further including:
prior to combining the first RX signal and the first TX signal to generate the first combined signal, applying a first RX weight to a signal indicative of the output of the ADC to generate the first RX signal, and/or
prior to combining the second RX signal and the second TX signal to generate the second combined signal, applying a second RX weight to a signal indicative of the output of the first RX processing unit to generate the second RX signal.

20. The method according to claim 18, further including:
prior to combining the first RX signal and the first TX signal to generate the first combined signal, applying a first RX delay to a signal indicative of the output of the ADC to generate the first RX signal, and/or prior to combining the second RX signal and the second TX signal to generate the second combined signal, applying a second RX delay to a signal indicative of the output of the first RX processing unit to generate the second RX signal.

21. An apparatus for implementing digital loopback for a radio frequency (RF) system, the apparatus comprising:
- a circuit for applying a first transmit (TX) weight to an output of a first TX processing unit to generate a weighted output of the first TX processing unit;
- a circuit for combining a first receive (RX) signal and a first TX signal to generate a first combined signal to be provided to a digital-to-analog (DAC), where the first RX signal is a signal indicative of an output of an analog-to-digital converter (ADC), and the first TX signal is a signal indicative of the weighted output of the first TX processing unit;
- a circuit for applying a second TX weight to a signal indicative of an input signal to generate a weighted input for the first TX processing unit; and
- a circuit for combining a second RX signal and a second TX signal to generate a second combined signal to be provided to the first TX processing unit, where the second RX signal is a signal indicative of an output of a first RX processing unit, and the second TX signal is a signal indicative of the weighted input for the first TX processing unit,
- wherein the output of the first TX processing unit is based on the second combined signal.

22. The apparatus according to claim 21, further including one or more circuits for:
prior to combining the first RX signal and the first TX signal to generate the first combined signal, applying a first RX weight to a signal indicative of the output of the ADC to generate the first RX signal, and/or
prior to combining the second RX signal and the second TX signal to generate the second combined signal, applying a second RX weight to a signal indicative of the output of the first RX processing unit to generate the second RX signal.

23. The apparatus according to claim 21, further including one or more circuits for:
prior to combining the first RX signal and the first TX signal to generate the first combined signal, applying a first RX delay to a signal indicative of the output of the ADC to generate the first RX signal, and/or
prior to combining the second RX signal and the second TX signal to generate the second combined signal, applying a second RX delay to a signal indicative of the output of the first RX processing unit to generate the second RX signal.

24. The apparatus according to claim 21, further including one or more of:
the first TX processing unit,
the first RX processing unit,
the DAC, and
the ADC.

25. The apparatus according to claim 24, wherein two or more of the ADC, the DAC, the first RX processing unit, the first TX processing unit, the circuit for applying the first TX weight, the circuit for combining the first RX signal and the first TX signal, the circuit for applying the second TX weight, and the circuit for combining the second RX signal and the second TX signal are integrated on a single die.

26. The apparatus according to claim 21, wherein the apparatus is an RF converter.

27. The apparatus according to claim 21, wherein the apparatus is a transmit signal front end device.

28. The apparatus according to claim 21, wherein the apparatus is an RF transceiver.

* * * * *